(12) United States Patent
Bradley et al.

(10) Patent No.: US 8,502,527 B2
(45) Date of Patent: Aug. 6, 2013

(54) TRANSMISSION DEBRIS SENSOR

(75) Inventors: Jesse B. Bradley, Royal Oak, MI (US); Kurt Mitts, Pontiac, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 392 days.

(21) Appl. No.: 12/900,978

(22) Filed: Oct. 8, 2010

(65) Prior Publication Data

US 2012/0086445 A1    Apr. 12, 2012

(51) Int. Cl.
*G01R 33/07* (2006.01)
(52) U.S. Cl.
USPC ........................................ 324/207.2; 324/251
(58) Field of Classification Search
USPC .............................................. 324/207.2, 251
See application file for complete search history.

(56) References Cited

U.S. PATENT DOCUMENTS

| | | | | |
|---|---|---|---|---|
| 5,334,932 A | * | 8/1994 | Nielsen | 324/204 |
| 5,465,078 A | * | 11/1995 | Jones, Jr. | 335/305 |
| 5,502,378 A | * | 3/1996 | Atteberry et al. | 324/204 |
| 2005/0067828 A1 | * | 3/2005 | Norton | 280/806 |

* cited by examiner

*Primary Examiner* — Bot Ledynh

(57) ABSTRACT

A debris sensor for a motor vehicle transmission includes a permanent magnet disposed on the inside bottom of the transmission pan to attract and retain magnetically attracted debris such as filings and particulates and a magnetic sensor such as a Hall effect sensor adjacent the permanent magnet. The magnetic sensor monitors, over time, the magnetic field of the debris collecting magnet. The output of the magnetic sensor is provided to a transmission control module (TCM) or similar electronic control or monitoring device. The output of the sensor is monitored and when the output changes sufficiently, relative to experimental or empirical data, a signal or alarm code is generated or stored relating to the possible need for transmission service. Alternatively, data from the sensor may be read at any time to infer the state of the transmission, the quantity of material on the magnet, a possible service issue based upon the quantity of material on the magnet and the vehicle mileage and the remaining service life of the magnet, for example.

11 Claims, 3 Drawing Sheets

TRANSMISSION DEBRIS SENSOR

FIELD

The present disclosure relates to sensors for motor vehicle transmissions and more particularly to a debris sensor for motor vehicle automatic or manual transmissions.

BACKGROUND

The statements in this section merely provide background information related to the present disclosure and may or may not constitute prior art.

Debris suspended in the fluid circulating within a motor vehicle transmission is essentially without exception deleterious. Such material generally has two sources: the gears, shafts and other mechanical components within the transmission and the cast housing. While housings are generally alloys of aluminum or magnesium, the gears, shafts and other components are typically fabricated of ferrous alloys and are thus magnetic.

Hence, it is known and common in the prior art to include a strong permanent magnet within the transmission housing which attracts and collects ferrous particulates from the transmission fluid as it circulates within the transmission. The permanent magnet is often located in the sump where the transmission fluid collects and the least rapid and turbulent flow occurs.

While the incorporation of debris collecting permanent magnets in the sumps of motor vehicle transmissions has proven to be a practical and inexpensive solution to the fluid carried, ferrous debris problem, it is not without its shortcomings. Primary among these shortcomings is the lack of monitoring or oversight. Since the magnet is generally secured to the inside bottom of the transmission pan, it is virtually impossible to determine the quantity of material collected on any given magnet at any given time and thus (1) conclude that the magnet has served its useful life and must be either cleaned or replaced, (2) provide an estimate of the remaining magnet life as a debris collecting component or (3) provide any assessment of debris related problems, without dropping the transmission pan and inspecting the magnet.

At the very least, dropping the transmission pan involves removing and re-installing a large plurality of machine bolts and providing a new gasket. Clearly, therefore, this step in not undertaken without some reason, such as replacement of the filter and transmission fluid or service to the internal components of the transmission. During such maintenance, of course, the debris collecting magnet can be either cleaned or replaced but such maintenance is today typically separated by long service intervals. From the foregoing, it is apparent that a means or method of monitoring the accumulation of debris on a permanent magnet debris collector of a motor vehicle transmission would be both desirable and useful.

SUMMARY

The present invention provides a debris sensor for a motor vehicle transmission. In many automatic and manual motor vehicle transmissions, it is common to secure a strong permanent magnet to the inside bottom of the transmission pan to attract and retain metal, magnetically attracted debris such as filings and particulates to prevent them from circulating with the transmission fluid. Proximate this magnet, a Hall effect sensor is disposed which monitors, over time, the magnetic field of the debris collecting magnet. The Hall Effect sensor is preferably an analog type and its output is provided to a transmission control module (TCM) or similar electronic control, processor or monitoring device. When the output changes sufficiently, as based on experimental and empirical data, a signal, flag or alarm code is reported or stored relating to, for example, a transmission condition or the apparent need for transmission service. Alternatively, data from the sensor may be read at any time to infer the state of the transmission, the quantity of material on the magnet, a possible service issue based upon the quantity of material on the magnet and the vehicle mileage, and the remaining service life of the magnet, for example.

Thus it is an aspect of the present invention to provide a transmission debris sensor.

It is a further aspect of the present invention to provide a transmission ferrous debris sensor.

It is a still further aspect of the present invention to provide a transmission debris sensor including a permanent magnet.

It is a still further aspect of the present invention to provide a transmission debris sensor including a Hall Effect sensor.

It is a still further aspect of the present invention to provide a transmission debris sensor including an analog output Hall Effect sensor.

It is a still further aspect of the present invention to provide a transmission debris sensor including a permanent magnet and a Hall Effect sensor.

It is a still further aspect of the present invention to provide a transmission debris sensor including a permanent magnet and a Hall Effect sensor which provides data to a transmission control module or processor.

Further aspects, advantages and areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
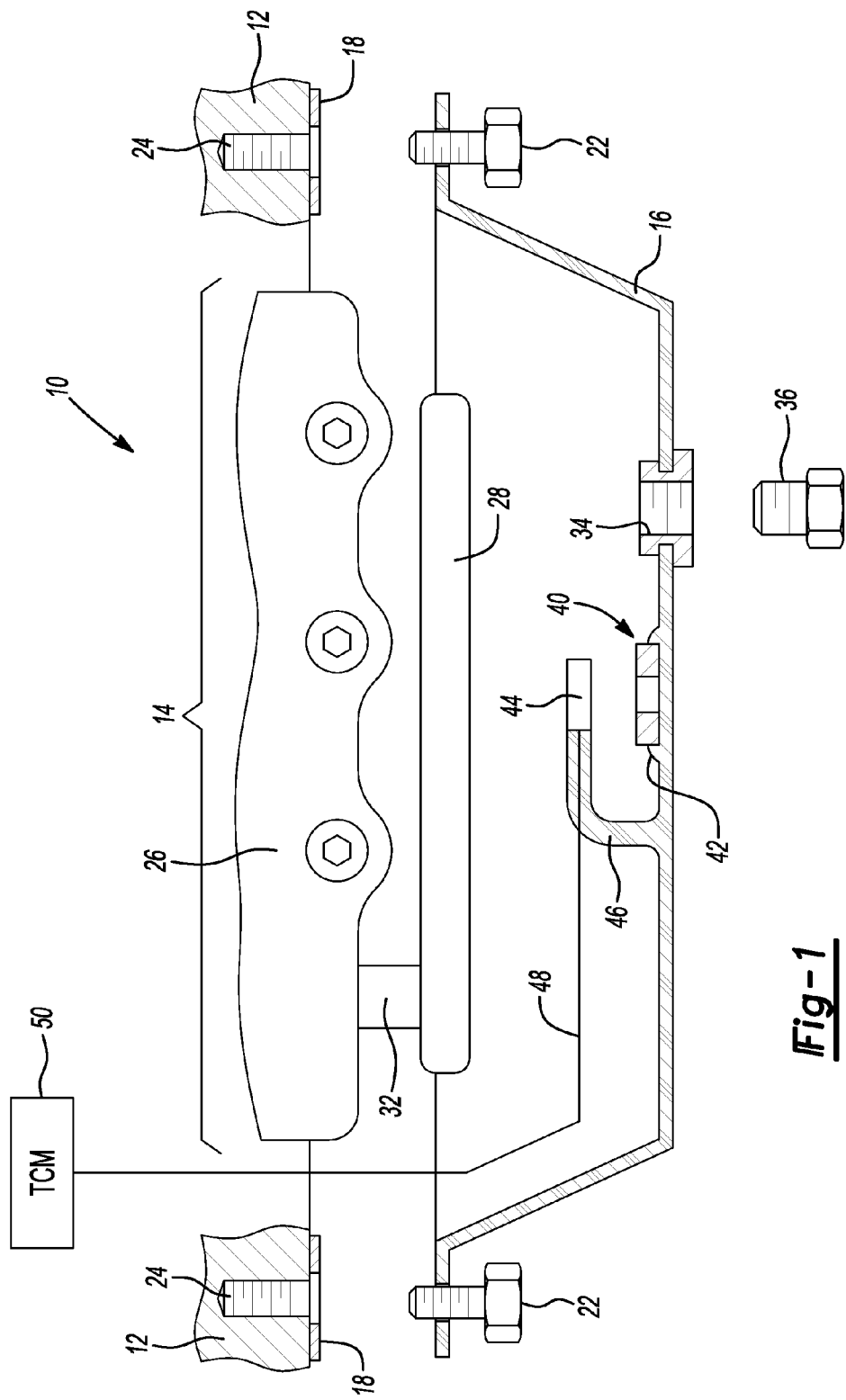
FIG. 1 is a full sectional view of a transmission oil pan having a permanent magnet debris collector and sensor according to the present invention.
Figure 2:
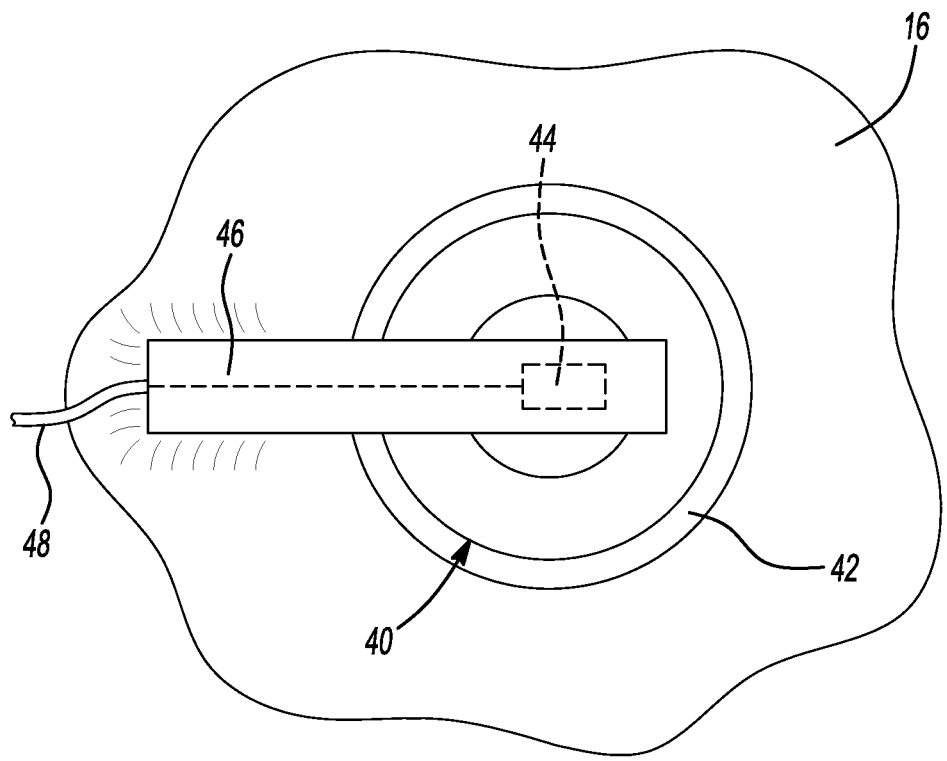
FIG. 2 is a top plan view of a portion of a transmission oil pan having a clean permanent magnet debris collector and sensor according to the present invention.

With reference to FIG. 1, a lower portion of an automatic transmission is illustrated and generally designated by the reference number 10. The automatic transmission 10 includes a housing 12 having a large bottom opening 14 which is closed off by a transmission oil pan 16. The transmission oil pan 16 is sealingly secured to the housing 12 with a peripheral gasket 18 and a plurality of threaded fasteners 22 which are received within a like plurality of blind, threaded openings 24 in the housing 12. Disposed within and secured to the housing 12 is a control valve body 26 which constitutes a portion of the actual transmission mechanism (not illustrated). A transmission fluid intake filter 28 is, in turn, secured to the valve body 26 by, for example, a suction or inlet fitting 32. The transmission oil pan 16 may also include a threaded access or drain port 34 which is selectively closed and sealed off by a complementarily threaded drain plug 36.

Preferably residing on the inside, bottom surface of the oil pan 16 is a permanent magnet 40. It should be appreciated that the lubricating oil or transmission fluid accumulates in the oil pan 16 during both operating and non-operating periods and thus it is fairly and often characterized as a sump. The permanent magnet 40 may be secured to the oil pan 16 by an interference fit with a circumferential flange 42, a mechanical clamp, retainer or fastener, a suitable, lubricant resistant adhesive or any other reliable and positive means. Alternatively, the permanent magnet 40 may be secured to a sidewall of the oil pan 16 or at any other convenient location where it will be exposed to, and preferably submerged in, the transmission oil.

The permanent magnet 40 may be an annulus, as illustrated, or its shape may be a solid, circular disc, a rectangular bar, a square or any other shape which provides a strong, effective and sensible magnet field. It will be appreciated that in this location, at the bottom of the transmission oil pan 16 and proximate the intake filter 28, the permanent magnet 40 is exposed to a significant but relatively slow and non-turbulent flow of transmission fluid as the automatic transmission 10 operates. Accordingly, ferrous particles that have worn or fallen off gears and other operating elements of the automatic transmission 10 and have become suspended and are circulating with the transmission fluid will be attracted to the permanent magnet 40 and retained on its surface.

Disposed adjacent the permanent magnet 40 and in proximate, sensing relationship thereto is a magnetic sensor 44 such as a Hall Effect sensor or other device such as a variable reluctance sensor capable of continuously sensing the magnetic field strength of the permanent magnet 40. Depending upon the sensing pattern of the magnetic sensor 44, it should be disposed generally so that its sensing pattern is symmetrically arranged or aligned with the permanent magnet 40 and its field. For example, if the magnetic sensor 44 has a diverging conical sensing pattern, the sensor should preferably be arranged relative to the permanent magnet 40 so that it "sees" a uniform overall or average and complete view of the permanent magnet 40 and its magnetic field. Although this is not necessary, it is preferable such that particles of essentially the same size attracted and retained on the permanent magnet 40 will have essentially the same effect on the signal provided by the magnetic sensor 44. The magnetic sensor 44 is mounted on a non-magnetic bracket or support 46 that may be secured to or formed integrally with the transmission oil pan 16. A multiple conductor (typically three) cable 48 carries electrical signals to and from the magnetic sensor 44.

The magnetic sensor 44 has an output such as a voltage signal that is provided to, for example, a transmission control module (TCM) 50 or a dedicated controller or microprocessor that accepts the data or signal, processes it and arrives at a determination regarding the state of contaminants on the permanent magnet 40. Such data, signal and determination may be utilized to generate and store an error or service code, trigger a service reminder or request any other appropriate action, indication or flag as described further below.

As noted, the magnetic sensor 44 is preferably a Hall Effect sensor and is further preferably an analog type sensor. Current, commercially available devices referred to as Hall Effect sensors include both signal amplification and temperature compensation in a compact, three terminal package and references herein to a Hall Effect sensor contemplate and comprehend such a device. As noted, the magnetic sensor 44 of the present invention is preferably an analog output Hall Effect sensor which provides a continuously variable output proportional to the sensed magnetic field strength of the permanent magnet 40. Given this output, the transmission control module 50 or other dedicated microcontroller or microprocessor can utilize the signal and render decisions and commands in accordance with all manner of previously stored programs, subroutines, data points and the like. For example, when the sensed magnetic field strength drops relatively steadily over time to a predetermined threshold level or value, a code or flag can be generated to signal that service may or should be performed. As a second example, if the sensed magnetic field strength drops in a sudden, significant step, regardless of the beginning and end point values, a component failure may be indicated and a code or flag generated that requires immediate service. Both of these events are described more fully below with reference to FIG. 4.

These applications and other similar applications and outcomes are readily achieved with an analog Hall Effect sensor and appropriate software in a transmission control module 50 or other dedicated microcontroller, processor or microprocessor. It should be understood, however, that a Hall Effect sensor having a binary or digital (two state) output, i.e., a Hall Effect switch, is also readily useable in the present invention. Such a device typically includes the amplification and temperature compensation noted above as well as a Schmitt trigger that provides either (and only) an ON or OFF output based upon whether the analog signal (and magnetic field strength) is above or below a preset or predetermined value, i.e., a calibrated trigger point. Here, the ON OFF signal may be utilized with less sophisticated circuitry to indicate, for example, that transmission service is required soon or promptly, depending, for example, upon the vehicle mileage or other known variables at the time the Hall Effect sensor output changes state.

Figure 3:
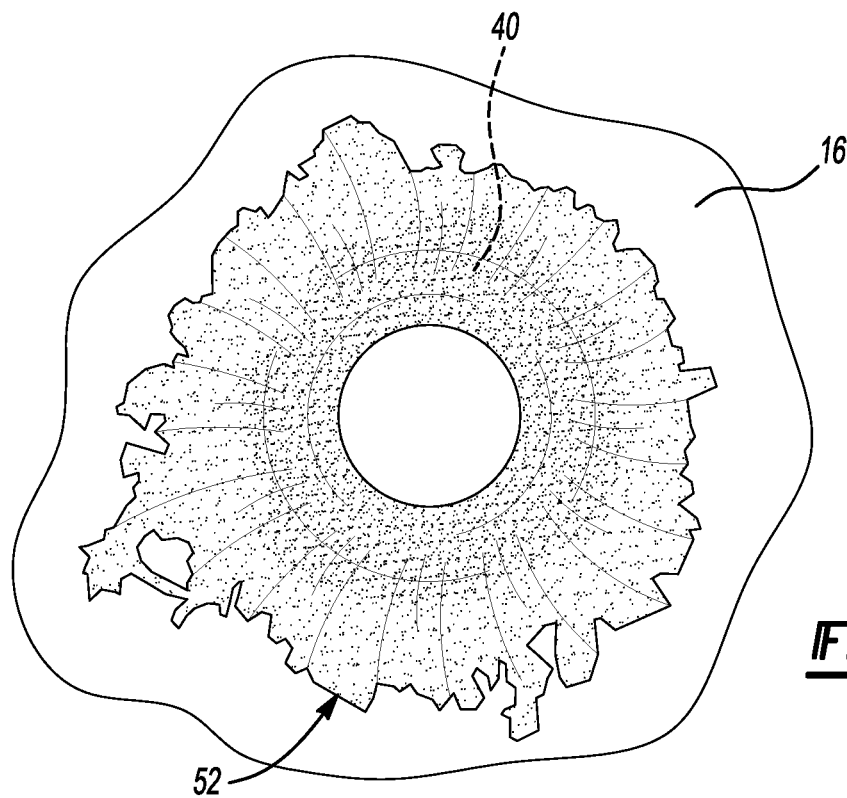
FIG. 3 is a top plan view of a portion of a transmission oil pan having a contaminated permanent magnet debris collector and sensor according to the present invention.

Referring briefly to FIG. 3, the permanent magnet 40 on the transmission oil pan 16 is illustrated with a significant accumulation of ferrous particulate matter 52. The illustration represents, in an exemplary fashion, the condition and appearance of the permanent magnet 40 after many hours of operation of the automatic transmission 10. It will be appreciated, as described further below, that such accumulation of ferrous particulate matter 52 reduces the magnetic field strength of the permanent magnet 40 relative to its initial, clean and uncontaminated state.

Figure 4:
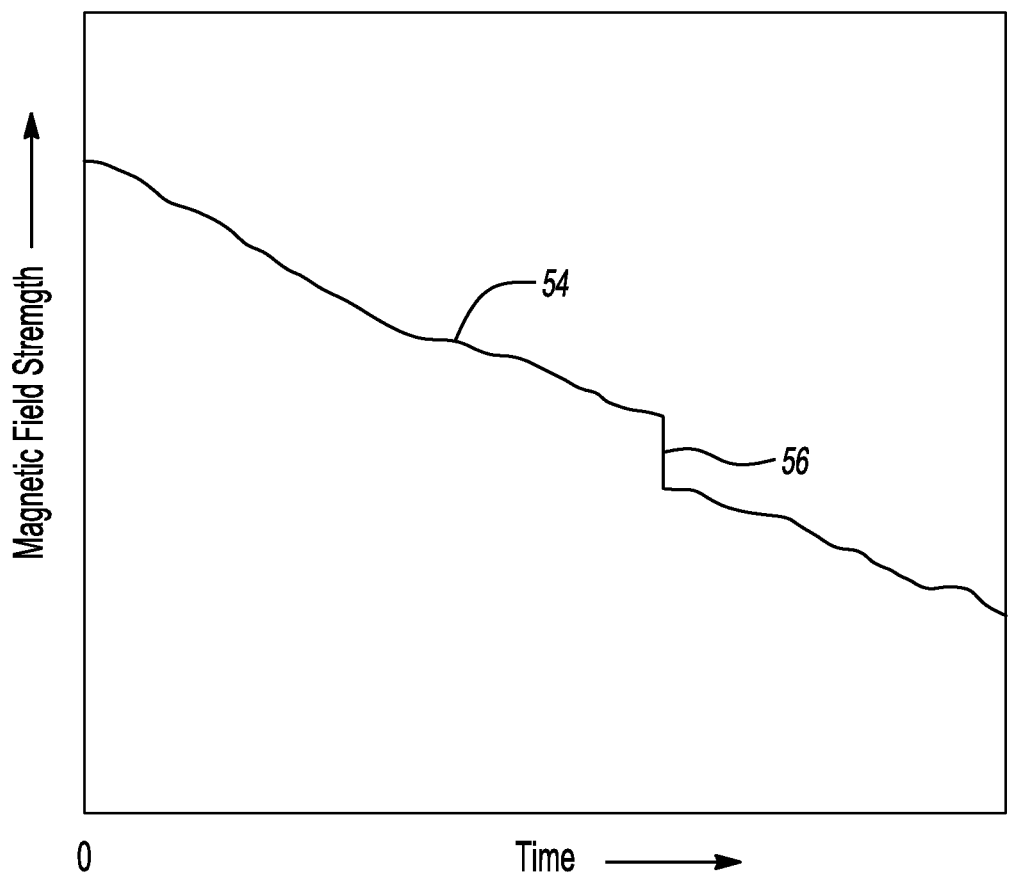
FIG. 4 is a graph portraying in an exemplary and representative manner the change in output over time of the sensor according to the present invention as an associated permanent magnet debris collector becomes contaminated.

Referring now to FIG. 4, as an example of operation, the transmission control module 50 or other electronic device may record a series of measurements indicating the gradual accumulation of debris on the permanent magnet 40 which can be reviewed by service personnel as necessary. This situation is illustrated in FIG. 4 as the gently sloping line 54 which indicates that the magnetic field strength of the permanent magnet 40 is slowly decreasing with operating time of the transmission 10. This data can then be compared to empirical and experimentally data generated or acquired from tests and other vehicles to determine if it is within acceptable limits or, alternatively, that a potential or actual problem exists. Additionally, a sudden increase in debris accumulation as read by the magnetic sensor 44 and as indicated by the abrupt transient or step 56 could indicate an impending or actual failure which could issue a command to the driver to seek immediate service or be passed along to the vehicle telematics and to satellite tracking equipment such as OnStar®. OnStar is a registered trademark of General Motors Corporation.

The description of the invention is merely exemplary in nature and variations that do not depart from the gist of the invention are intended to be within the scope of the invention and the following claims. Such variations are not to be regarded as a departure from the spirit and scope of the invention.

What is claimed is:

1. A debris sensor for a transmission comprising, in combination,
    a transmission oil pan having an inside surface,
    a permanent magnet secured to said inside surface of said transmission oil pan,
    a non-magnetic bracket extending from said transmission oil pan,
    a Hall effect device secured to said non-magnetic bracket and disposed in proximate, sensing relationship with said permanent magnet, said Hall effect device having an output, and
    a controller having an input for receiving said output from said Hall effect device and a processor for processing said output and providing data regarding an accumulation of debris on said permanent magnet.

2. The debris sensor for a transmission of claim 1 wherein said Hall effect device is one of an analog output Hall Effect sensor and a Hall Effect switch.

3. The debris sensor for a transmission of claim 1 wherein said permanent magnet is in a shape of an annulus.

4. The debris sensor for a transmission of claim 1 wherein said permanent magnet is disposed in a sump in a transmission.

5. The debris sensor for a transmission of claim 1 wherein said controller further includes a memory for storing a plurality of said data regarding an accumulation of debris.

6. The debris sensor for a transmission of claim 1 wherein said Hall effect sensor has a sensing pattern substantially uniformly arranged relative to a magnetic field of said permanent magnet.

7. A transmission debris sensor comprising, in combination,
    a transmission oil pan defining a sump and having an inside surface,
    a permanent magnet secured on said inside surface of said transmission oil pan,
    a non-magnetic bracket extending from said transmission oil pan,
    a Hall Effect sensor secured to said non-magnetic bracket and disposed in proximate, sensing relationship with said permanent magnet, said Hall Effect sensor having an output,
    a controller having an input for receiving said output, a processor for processing said output and providing data regarding an accumulation of debris on said permanent magnet and a memory for storing a plurality of said data regarding an accumulation of debris.

8. The transmission debris sensor of claim 7 wherein said Hall Effect sensor has an analog output.

9. The transmission debris sensor of claim 7 wherein said Hall Effect sensor has a two state output.

10. The transmission debris sensor of claim 7 wherein said permanent magnet defines an annulus.

11. The transmission debris sensor of claim 7 wherein said Hall Effect sensor has a sensing pattern substantially uniformly arranged relative to a magnetic field said permanent magnet.

* * * * *